United States Patent
Kim

(10) Patent No.: US 11,632,129 B2
(45) Date of Patent: Apr. 18, 2023

(54) METHOD AND APPARATUS FOR COMPRESSING WEIGHTS OF NEURAL NETWORK

(71) Applicant: SAMSUNG ELECTRONICS CO., LTD., Suwon-si (KR)

(72) Inventor: Hoyoung Kim, Seoul (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 17/965,141

(22) Filed: Oct. 13, 2022

(65) Prior Publication Data

US 2023/0033423 A1    Feb. 2, 2023

Related U.S. Application Data

(63) Continuation of application No. 17/394,584, filed on Aug. 5, 2021, now Pat. No. 11,502,701.

(30) Foreign Application Priority Data

Nov. 24, 2020   (KR) .................. 10-2020-0159160

(51) Int. Cl.
    *H03M 7/00*   (2006.01)
    *H03M 7/30*   (2006.01)
    (Continued)

(52) U.S. Cl.
    CPC ............ *H03M 7/70* (2013.01); *G06N 3/02* (2013.01); *G06N 3/063* (2013.01); *G06N 3/082* (2013.01); *H03M 7/40* (2013.01); *H03M 7/46* (2013.01)

(58) Field of Classification Search
    CPC ............ H03M 7/70; H03M 7/40; H03M 7/46; G06N 3/063; G06N 3/082
    See application file for complete search history.

(56) References Cited

U.S. PATENT DOCUMENTS 6,917,315 B2   7/2005  Gergely et al.
7,143,046 B2   11/2006 Babu et al.
(Continued)

FOREIGN PATENT DOCUMENTS

KR   10-2017-0128080 A   11/2017
KR   10-2019-0130455 A   11/2019
(Continued)

OTHER PUBLICATIONS

Reagan, et al. "Weightless: Lossy Weight Encoding for Deep Neural Network Compression." *International Conference on Machine Learning.* PMLR, Jul. 2018. (10 pages in English).
(Continued)

*Primary Examiner* — Joseph J Lauture
(74) *Attorney, Agent, or Firm* — NSIP Law

(57) ABSTRACT

A method of compressing weights of a neural network includes compressing a weight set including the weights of a the neural network, determining modified weight sets by changing at least one of the weights, calculating compression efficiency values for the determined modified weight sets based on a result of compressing the weight set and results of compressing the determined modified weight sets, determining a target weight of the weights satisfying a compression efficiency condition among the weights based on the calculated compression efficiency values, and determining a final compression result by compressing the weights based on a result of replacing the determined target weight.

13 Claims, 7 Drawing Sheets

(51) Int. Cl.
    *G06N 3/02*     (2006.01)
    *H03M 7/46*     (2006.01)
    *H03M 7/40*     (2006.01)
    *G06N 3/063*     (2023.01)
    *G06N 3/082*     (2023.01)

(56) References Cited

U.S. PATENT DOCUMENTS

| | | |
|---|---|---|
| 2018/0082181 A1 | 3/2018 | Brothers et al. |
| 2019/0050734 A1 | 2/2019 | Li et al. |
| 2019/0279089 A1 | 9/2019 | Wang |
| 2021/0407146 A1* | 12/2021 | Jiang ................. G06T 9/002 |

FOREIGN PATENT DOCUMENTS

| | | |
|---|---|---|
| KR | 10-2020-0049422 A | 5/2020 |
| KR | 10-2020-0052200 A | 5/2020 |
| KR | 10-2020-0064348 A | 6/2020 |

OTHER PUBLICATIONS

Mahmoud, et al. "Diffy: A Déjà vu-Dree Differential Deep Neural Network Accelerator." *51st Annual IEEE/ACM International Symposium on Microarchitecture (MICRO).* IEEE, Oct. 2018. (14 pages in English).

\* cited by examiner

METHOD AND APPARATUS FOR COMPRESSING WEIGHTS OF NEURAL NETWORK

CROSS-REFERENCE TO RELATED APPLICATIONS

This application is a continuation of application Ser. No. 17/394,584 filed on Aug. 5, 2021, which claims the benefit under 35 USC § 119(a) of Korean Patent Application No. 10-2020-0159160 filed on Nov. 24, 2020, in the Korean Intellectual Property Office, the entire disclosure of which is incorporated herein by reference for all purposes.

BACKGROUND

1. Field

The following description relates to a method and apparatus for compressing weights of a neural network.

2. Description of Related Art

A neural network may require a lot of operations on complex input data. As the amount of data to be learned by the neural network increases, the connection between layers constituting the neural network may become complex. In addition, as the amount of data to be learned by the neural network increases, the accuracy increases for past training data, but over-fitting may occur that the reliability of the values predicted for new input data decreases. As the complexity of the neural network increases, the amount of memory allocation also excessively increases, which may cause issues in miniaturization and commercialization.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a method of compressing weights of a neural network includes compressing a weight set including the weights of the neural network, determining modified weight sets by changing at least one of the weights, calculating compression efficiency values for the determined modified weight sets based on a result of compressing the weight set and results of compressing the determined modified weight sets, determining a target weight of the weights satisfying a compression efficiency condition based on the calculated compression efficiency values, and determining a final compression result by compressing the weights based on a result of replacing the determined target weight.

The calculating may include calculating differences between a size of the result of compressing the weight set and sizes of the results of compressing the determined modified weight sets, calculating change errors between the weight set and the determined modified weight sets, and calculating the compression efficiency values for the determined modified weight sets based on the calculated differences and the calculated change errors.

The calculating of the change errors may include calculating, in response to a first modified weight set being determined by changing a first weight of the weights to a weight neighboring the first weight, a change error between the weight set and the first modified weight set based on a frequency of the first weight and a difference between the first weight and the weight neighboring the first weight.

The determining of the modified weight sets may include selecting one of the weights based on a distribution of the weights, and changing a weight neighboring the selected weight to the selected weight.

The determining of the modified weight sets may include determining a first modified weight set by replacing a first weight of the weights with a weight neighboring the first weight.

The determining of the target weight may include determining the first weight to be the target weight in response to a compression efficiency value for the first modified weight set being greatest among the calculated compression efficiency values.

The determining of the target weight may include identifying a modified weight set having a compression efficiency value greater than or equal to a threshold by comparing the calculated compression efficiency values to the threshold, and determining, in response to the identified modified weight set being determined by changing a predetermined weight in the weight set, the predetermined weight to be the target weight.

The determining of the modified weight sets may include determining n modified weight sets by replacing each of different weights of the weights with a weight neighboring each of the different weights, where n is a natural number.

The determining of the target weight may include determining each of the different weights to be the target weight in response to compression efficiency values for the n modified weight sets being greater than a threshold.

The determining of the final compression result may include determining an additional modified weight set by replacing each of the different weights with a weight neighboring each of the different weights, and determining a result of compressing the determined additional modified weight set to be the final compression result.

The determining of the final compression result may include identifying at least one weight having a distribution change and weights having no distribution change in a modified weight set determined by replacing the determined target weight with a weight neighboring the target weight, training the neural network to tune the weights having no distribution change and not to tune the at least one weight having a distribution change, and compressing the not-tuned at least one weight and the tuned weights.

A non-transitory computer-readable storage medium storing instructions that, when executed by one or more processors, cause the one or more processors to perform the method above.

In another general aspect, a compression apparatus includes one or more processors configured to compress a weight set including weights of a neural network, determine modified weight sets by changing at least one of the weights, calculate compression efficiency values for the determined modified weight sets based on a result of compressing the weight set and results of compressing the determined modified weight sets, determine a target weight of the weights satisfying a compression efficiency condition based on the calculated compression efficiency values, and determine a final compression result by compressing the weights based on a result of replacing the determined target weight.

The one or more processors may be further configured to calculate differences between a size of the result of compressing the weight set and sizes of the results of compressing the determined modified weight sets, calculate change errors between the weight set and the determined modified weight sets, and calculate the compression efficiency values for the determined modified weight sets based on the calculated differences and the calculated change errors.

The one or more processors may be further configured to calculate, in response to a first modified weight set being determined by changing a first weight of the weights to a weight neighboring the first weight, a change error between the weight set and the first modified weight set based on a difference between the first weight and the weight neighboring the first weight and a frequency of the first weight.

The one or more processors may be further configured to select one of the weights based on a distribution of the weights, and change a weight neighboring the selected weight to the selected weight.

The one or more processors may be further configured to determine a first modified weight set by replacing a first weight of the weights with a weight neighboring the first weight, and determine the first weight to be the target weight in response to a compression efficiency value for the first modified weight set being greatest among the calculated compression efficiency values.

The one or more processors may be further configured to identify a modified weight set having a compression efficiency value greater than or equal to a threshold by comparing the calculated compression efficiency values to the threshold, and determine, in response to the identified modified weight set being determined by changing a predetermined weight in the weight set, the predetermined weight to be the target weight.

The one or more processors may be further configured to determine each of different weights to be the target weight in response to compression efficiency values for n modified weight sets being greater than a threshold, where the n modified weight sets are determined by replacing each of the different weights among the weight with a weight neighboring each of the different weights.

The one or more processors may be further configured to determine an additional modified weight set by replacing each of the different weights with a weight neighboring each of the different weights, and determine a result of compressing the determined additional modified weight set to be the final compression result.

The one or more processors may be further configured to identify at least one weight having a distribution change and weights having no distribution change in a modified weight set determined by replacing the determined target weight with a weight neighboring the target weight, train the neural network to tune the weights having no distribution change and not to tune the at least one weight having a distribution change, and compress the not-tuned at least one weight and the tuned weights.

The compression apparatus may further include a memory configured to store the weights and instructions. The one or more processors may be further configured to execute the instructions to configure the one or more processors to: compress the weight set including the weights of the neural network, determine the modified weight sets by changing the at least one of the weights, calculate the compression efficiency values for the determined modified weight sets based on the result of compressing the weight set and the results of the compressing of the determined modified weight sets, determine the target weight of the weights satisfying the compression efficiency condition based on the calculated compression efficiency values, and determine the final compression result by the compressing of the weights based on the result of replacing the determined target weight.

Other features and aspects will be apparent from the following detailed description, the drawings, and the claims.

Figure 1:
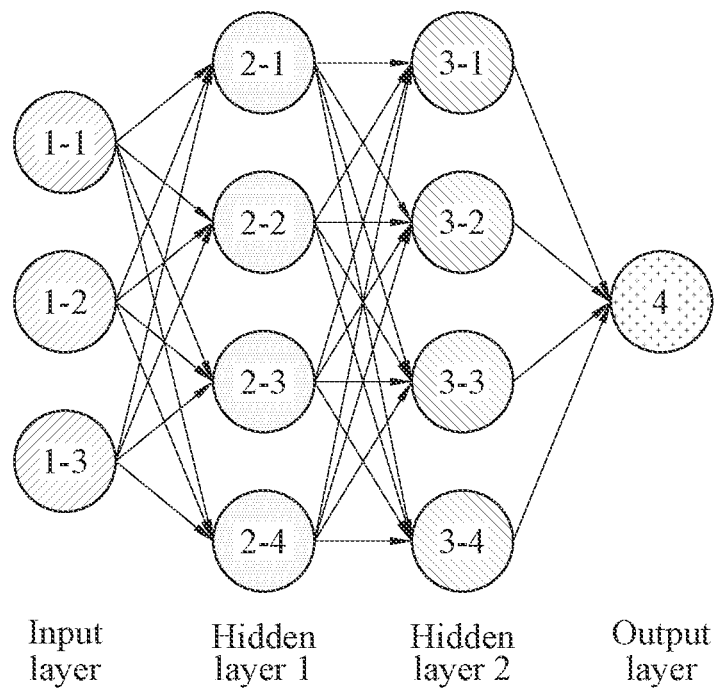
FIG. 1 illustrates an example of a neural network.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after understanding of the disclosure of this application may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

The features of the examples described herein may be combined in various ways as will be apparent after an understanding of the disclosure of this application. Further, although the examples described herein have a variety of configurations, other configurations are possible as will be apparent after an understanding of the disclosure of this application.

Unless otherwise defined, all terms, including technical and scientific terms, used herein have the same meaning as commonly understood by one of ordinary skill in the art to which this disclosure pertains. Terms, such as those defined in commonly used dictionaries, are to be interpreted as having a meaning that is consistent with their meaning in the context of the relevant art, and are not to be interpreted in an idealized or overly formal sense unless expressly so defined herein.

FIG. 1 illustrates an example of a neural network.

Referring to FIG. 1, a schematic structure of a deep neural network, an example of a neural network, is illustrated. Hereinafter, for ease of description, a deep neural network structure will be described as an example. However, examples are not limited thereto. Various structures of neural networks may be used.

A deep neural network is one scheme of implementing a neural network and includes layers. The deep neural network may include, for example, an input layer to which input data are input, an output layer that outputs result values derived through input data-based prediction through training, and multiple hidden layers between the input layer and the output layer.

The deep neural network may be classified as a convolutional neural network or a recurrent neural network, depending on an algorithm used to process information. Hereinafter, for the general custom in the field of neural networks, the input layer may be referred to as the lowest layer, the output layer may be referred to as the highest layer, and the layers may be named by sequentially to designate the ranks of the layers from the output layer being the highest layer to the input layer being the lowest layer. In FIG. 1, a hidden layer 2 may be a higher layer than a hidden layer 1, and the input layer and lower than the output layer.

A relatively higher layer may output a predetermined operation result between adjacent layers in the deep neural network by receiving a value obtained by applying a bias to a product of an output value of a relatively lower layer and a weight. In this example, the output operation result may be applied to an upper layer adjacent to the corresponding layer in a similar manner.

A method of training a neural network is referred to as, for example, deep learning. As described above, various algorithms such as a convolution neural network and a recurrent neural network may be used for deep learning.

"Training a neural network" may be construed as including determining and updating one or more weights and biases between layers and/or determining and updating one or more weights and biases between neurons included in different layers among neighboring layers.

The layers, the hierarchical structure among the layers, and the weights and biases between the neurons may be collectively expressed as "the connectivity" of the neural network. Accordingly, "training a neural network" may also be construed as building and training the connectivity.

Each of the layers in the neural network may include nodes. The nodes may correspond to the neurons in the neural network. The term "neuron" may be interchangeably used as the term "node."

The deep neural network in FIG. 1 shows connections formed between combinations of nodes included in a layer and nodes included in another layer adjacent to the layer. When the combinations of all nodes included in adjacent layers are connected to each other in the neural network, the layers may be referred to as being "fully-connected." A node 3-1 in the hidden layer 2 shown in FIG. 1 may be connected to all nodes, a node 2-1 to a node 2-4, of the hidden layer 1 and receive products of output values of the respective nodes and predetermined weights.

By processing the data input to the input layer through the hidden layers, the output values may be output through the output layer. In this example, the greater the weight by which the output value of each node is multiplied, the more the connectivity between the corresponding two nodes may be enhanced. The smaller the weight by which the output value of each node is multiplied, the more the connectivity between the two nodes may be weakened. If the weight is "0", it may indicate no connection between the two nodes.

As the connectivity between nodes increases through weights, the connectivity of the neural network may be enhanced, and the complexity may increase. Accordingly, the number of movements for transmitting the weights from a host to a target device may increase. Although it will be described later, the target device may be a device for performing inference of the neural network and include, for example, a neural processing unit (NPU), a graphics processing unit (GPU), and the like. However, examples are not limited thereto.

In an example, a compression apparatus may compress the weights of the neural network. To this end, the compression apparatus may change one or more weights determined to have good compression efficiency among the weights of the neural network. Accordingly, the compression apparatus may prevent a reduction in the inference accuracy of the neural network compared to the compression rate. Hereinafter, weight compression will be further described.

FIGS. 2 to 7 illustrate examples of weight compression by a compression apparatus.

Figure 2:
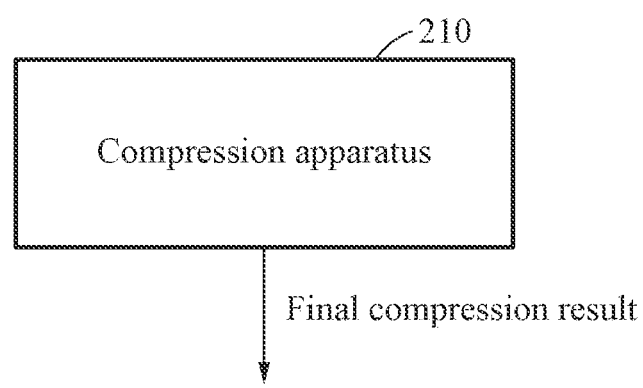
FIGS. 2 to 7 illustrate examples of weight compression by a compression apparatus.

Referring to FIG. 2, a compression apparatus 210 may obtain weights of a neural network. In this example, the neural network may be pre-trained. Herein, it is noted that use of the term 'may' with respect to an example or embodiment, e.g., as to what an example or embodiment may include or implement, means that at least one example or embodiment exists where such a feature is included or implemented while all examples and embodiments are not limited thereto.

Depending on the implementation, the compression apparatus 210 may perform pruning on the weights. By the pruning, weights having values smaller than a pruning threshold may be changed to "0".

The compression apparatus 210 may determine a target weight satisfying a compression efficiency condition among the neural network's weights. Hereinafter, an example of using Huffman coding as a compression scheme will be described with reference to FIGS. 3 to 5, and an example of using run length coding (RLC) as the compressions scheme will be described with reference to FIGS. 6 and 7. However, the compression scheme is not limited to Huffman coding and RLC.

Figure 3:
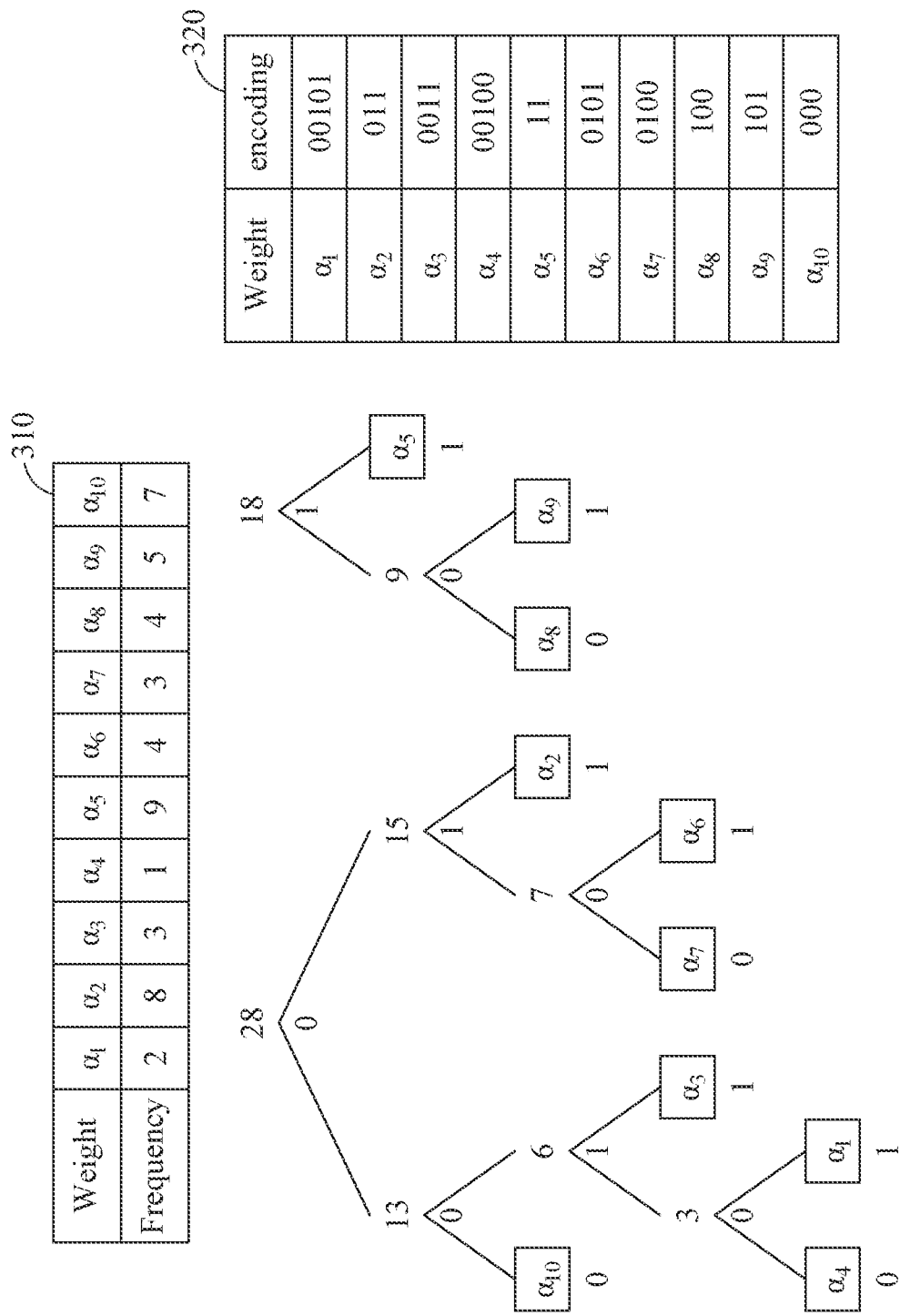

Referring to FIG. 3, the compression apparatus 210 may compress a weight set including weights of a neural network according to Huffman coding. In the example of FIG. 3, the weight set may include two "$\alpha_1$"s, eight "$\alpha_2$"s, three "$\alpha_3$"s, one "$\alpha_4$", nine "$\alpha_5$"s, four "$\alpha_6$"s, three "$\alpha_7$"s, four "$\alpha_8$"s, five "$\alpha_9$"s, and seven "$\alpha_{10}$"s. The compression apparatus 210 may determine frequency information 310 for the weights by analyzing the weights' distribution and generating a compression result 320 by compressing the weight set based on the frequency information 310. As in the example of FIG. 3, the compression apparatus 210 may encode the weight $\alpha_5$ having the highest frequency using the smallest number of bits and encode the weight $\alpha_4$ having the lowest frequency using the largest number of bits.

Assuming each of the weights $\alpha_1$ to $\alpha_{10}$ is 1 bit, the size (or length) of the compression result 320 may be 145 bits.

The compression apparatus 210 may determine modified weight sets by changing at least one of the weights $\alpha_1$ to $\alpha_{10}$. For example, the compression apparatus 210 may find the most frequent weight $\alpha_5$ based on the frequency information 310 or the compression result 320 and replace a weight neighboring the most frequent weight $\alpha_5$ with the most frequent weight $\alpha_5$.

Figure 4:
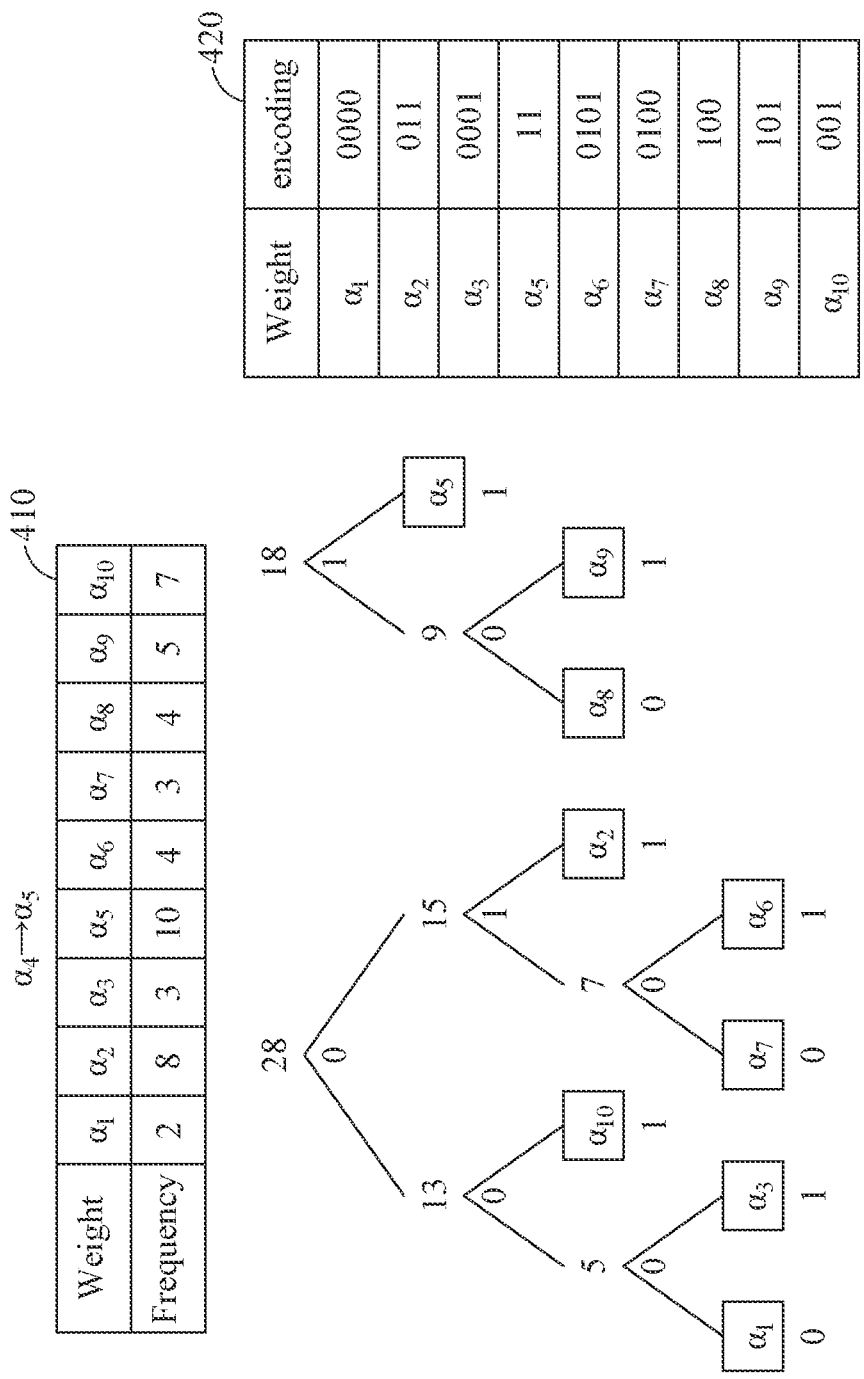

As in the example of FIG. 4, the compression apparatus 210 may replace the weight $\alpha_4$ neighboring the most frequent weight $\alpha_5$ with the most frequent weight $\alpha_5$. The compression apparatus 210 may determine a first modified weight set by replacing the weight $\alpha_4$ with the weight $\alpha_5$. The first modified weight set may include two "$\alpha_1$"s, eight "$\alpha_2$"s, three "$\alpha_3$"s, ten "$\alpha_5$"s, four "$\alpha_6$"s, three "$\alpha_7$"s, four "$\alpha_8$"s, five "$\alpha_9$"s, and seven "$\alpha_{10}$"s. The compression apparatus 210 may determine frequency information 410 in which the weight $\alpha_4$ is replaced with the weight $\alpha_5$ and generate a compression result 420 by compressing the first modified weight set based on the frequency information 410.

The size (or length) of the compression result 420 may be 140 bits.

The compression apparatus 210 may calculate a compression efficiency value for the first modified weight set based on the compression result 320 and the compression result 420. For example, the compression apparatus 210 may calculate a difference between the size of the compression result 320 and the size of the compression result 420,
calculate a change error between the weight set and the first modified weight set and calculate the compression efficiency value for the first modified weight set based on the calculated size difference and the calculated change error. In the example of FIG. 4, the size of the compression result 320 is 145 bits, and the size of the compression result 420 is 140 bits. Thus, the compression apparatus 210 may calculate "5" as the difference between the size of the compression result 320 and the compression result 420. The compression apparatus 210 may calculate a change error between the weight set and the first modified weight set by multiplying "$\alpha_5-\alpha_4$", which is the difference between the weight $\alpha_5$ and the weight $\alpha_4$, by the frequency of the weight $\alpha_4$. Since the frequency of the weight $\alpha_4$ in the weight set is "1", the change error between the weight set and the first modified weight set may be "$\alpha_5-\alpha_4$". The compression apparatus 210 may calculate the compression efficiency value for the first modified weight set by dividing the calculated size difference "5" by the change error "$\alpha_5-\alpha_4$". In other words, the compression apparatus 210 may determine "$5/(\alpha_5-\alpha_4)$" to be the compression efficiency value for the first modified weight set.

In the weight set, the most frequent weight $\alpha_5$ neighbors both the weight $\alpha_4$ and the weight $\alpha_6$. Similar to the description provided with reference to FIG. 4, the compression apparatus 210 may replace the weight $\alpha_6$ neighboring the most frequent weight $\alpha_5$ with the most frequent weight $\alpha_5$ in the weight set. The compression apparatus 210 may determine a second modified weight set by replacing the weight $\alpha_6$ with the weight $\alpha_5$. The second modified weight set may include two "$\alpha_1$"s, eight "$\alpha_2$"s, three "$\alpha_3$"s, one "$\alpha_4$", thirteen "$\alpha_5$"s, three "$\alpha_7$"s, four "$\alpha_8$"s, five "$\alpha_9$"s, and seven "$\alpha_{10}$"s. The second modified weight set includes thirteen "$\alpha_5$"s because four "$\alpha_6$"s are replaced with $\alpha_5$. The compression apparatus 210 may determine frequency information in which the weight $\alpha_6$ is replaced with the weight $\alpha_5$ and compress the second modified weight set based on the determined frequency information. The compression apparatus 210 may calculate a compression efficiency value for the second modified weight set based on the compression result 320 and a result of compressing the second modified weight set.

In the weight set, the weight $\alpha_2$ has the second-highest frequency and neighbors the weight $\alpha_1$. Since the frequency of the weight $\alpha_2$ is higher than the frequency of the weight $\alpha_1$, the compression apparatus 210 may determine a third modified weight set by replacing the weight $\alpha_1$ with the weight $\alpha_2$. The compression apparatus 210 may compress the third modified weight set and calculate a compression efficiency value for the third modified weight set based on the compression result 320 and a result of compressing the third modified weight set. In the weight set, the weight $\alpha_2$ neighbors the weight $\alpha_3$, and the frequency of the weight $\alpha_2$ is higher than the frequency of the weight $\alpha_3$. The compression apparatus 210 may determine a fourth modified weight set by replacing the weight $\alpha_3$ neighboring the weight $\alpha_2$ with the weight $\alpha_2$. The compression apparatus 210 may compress the fourth modified weight set and calculate a compression efficiency value for the fourth modified weight set based on the compression result 320 and a result of compressing the fourth modified weight set.

In the weight set, the weight $\alpha_{10}$ has the third-highest frequency and neighbors the weight $\alpha_9$. Since the frequency of the weight $\alpha_{10}$ is higher than the frequency of the weight $\alpha_9$, the compression apparatus 210 may determine a fifth modified weight set by replacing the weight $\alpha_9$ with the weight $\alpha_{10}$. The compression apparatus 210 may compress the fifth modified weight set and calculate a compression efficiency value for the fifth modified weight set based on the compression result 320 and a result of compressing the fifth modified weight set.

In the weight set, the weight $\alpha_9$ has the fourth-highest frequency and neighbors the weight $\alpha_{10}$ and the weight $\alpha_8$. In this example, since the frequency of the weight $\alpha_9$ is lower than the frequency of the weight $\alpha_{10}$, the compression apparatus 210 may not replace the weight $\alpha_{10}$ with the weight $\alpha_9$. Since the frequency of the weight $\alpha_9$ is higher than the frequency of the weight $\alpha_8$, the compression apparatus 210 may determine a sixth modified weight set by replacing the weight $\alpha_8$ with the weight $\alpha_9$. The compression apparatus 210 may compress the sixth modified weight set and calculate a compression efficiency value for the sixth modified weight set based on the compression result 320 and a result of compressing the sixth modified weight set.

In this way, the compression apparatus 210 may determine modified weight sets by changing at least one of the weights in the weight set and calculate a compression efficiency value for each of the modified weight sets based on the compression result 320 and a result of compressing each of the modified weight sets.

The compression apparatus 210 may determine a target weight satisfying a compression efficiency condition among the weights based on the compression efficiency value for each of the modified weight sets. For example, when the compression efficiency value "$5/(\alpha_5-\alpha_4)$" for the first modified weight set is greatest among the compression efficiency values for the modified weight sets, the compression apparatus 210 may determine the weight $\alpha_4$ to be the target weight. In other words, since replacing the weight $\alpha_4$ with the weight $\alpha_5$ maximizes the compression efficiency compared to the change error, the compression apparatus 210 may determine the weight $\alpha_4$ to be the target weight.

When the weight $\alpha_4$ is determined to be the target weight, the compression apparatus 210 may determine a final compression result based on a result of replacing the weight $\alpha_4$, that is, the first modified weight set.

As an example, the compression apparatus 210 may determine the compression result 420 to be the final compression result.

As another example, the compression apparatus 210 may train a neural network for performing fine-tuning on the first modified weight set. In this example, the compression apparatus 210 may train the neural network while fixing the weight that has changed. In detail, as described above, the first modified weight set includes include two "$\alpha_1$"s, eight "$\alpha_2$"s, three "$\alpha_3$"s, ten "$\alpha_5$"s, four "$\alpha_6$"s, three "$\alpha_7$"s, four "$\alpha_8$"s, five "$\alpha_9$"s, and seven "$\alpha_{10}$"s. When the weight $\alpha_4$ is replaced with the weight $\alpha_5$, the distribution of the weight $\alpha_5$ changes. The compression apparatus 210 may identify or distinguish between the weight $\alpha_5$ having a distribution change and the weights $\alpha_1$, $\alpha_2$, $\alpha_3$, $\alpha_6$, $\alpha_7$, $\alpha_8$, $\alpha_9$, and $\alpha_{10}$ having no distribution change in the first modified weight set. The compression apparatus 210 may train the neural network not to tune the weight $\alpha_5$ having a distribution change but to tune the weights $\alpha_1$, $\alpha_2$, $\alpha_3$, $\alpha_6$, $\alpha_7$, $\alpha_8$, $\alpha_9$, and $\alpha_{10}$ having no distribution change. Accordingly, the inference accuracy of the neural network may improve further. The compression apparatus 210 may compress the not-tuned weight $\alpha_5$ and the tuned weights $\alpha_1$, $\alpha_2$, $\alpha_3$, $\alpha_6$, $\alpha_7$, $\alpha_8$, $\alpha_9$, and $\alpha_{10}$ and determine a result of compressing the not-tuned weight $\alpha_5$ and the tuned weights $\alpha_1$, $\alpha_2$, $\alpha_3$, $\alpha_6$, $\alpha_7$, $\alpha_8$, $\alpha_9$, and $\alpha_{10}$ to be the final compression result.

Hereinbefore, the example of determining the weight $\alpha_4$ having the greatest compression efficiency to be the target weight has been described. Examples are not limited thereto, and the compression apparatus 210 may determine the target weight by comparing the compression efficiency value for each modified weight set to a threshold. In detail, the compression efficiency value for the first modified weight set in which the weight $\alpha_4$ is replaced with the weight $\alpha_5$, the compression efficiency value for the second modified weight set in which the weight $\alpha_6$ is replaced with the weight $\alpha_5$, and the compression efficiency value for the third modified weight set in which the weight $\alpha_1$ is replaced with the weight $\alpha_2$ may be greater than or equal to the threshold. In this case, the compression apparatus 210 may determine each of the weight $\alpha_1$, the weight $\alpha_4$, and the weight $\alpha_6$ to be a target weight. In other words, the compression apparatus 210 may determine each of the weight $\alpha_1$, the weight $\alpha_4$, and the weight $\alpha_6$ that make the compression efficiency value greater than or equal to the threshold to be the target weight.

Figure 5:
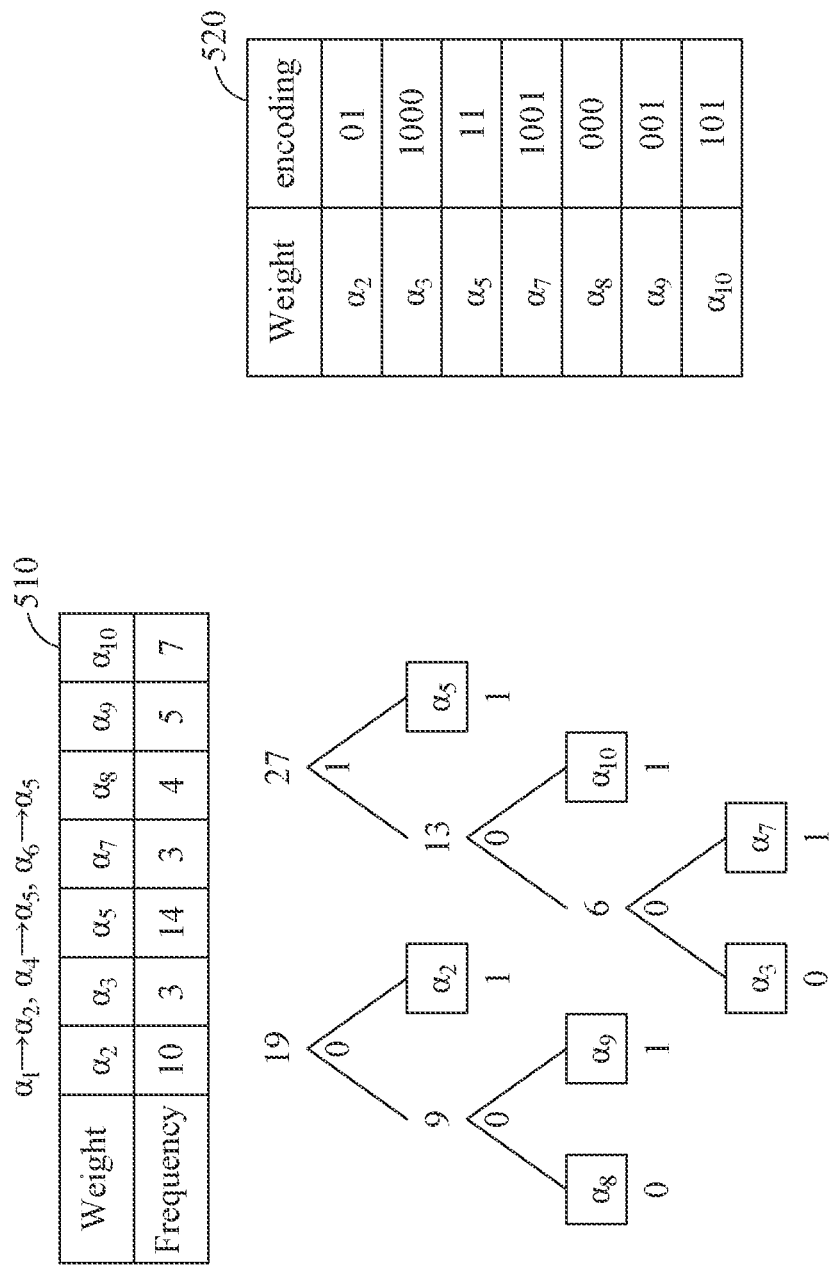

The compression apparatus 210 may replace the weight $\alpha_1$ with the weight $\alpha_2$, the weight $\alpha_4$ with the weight $\alpha_5$, and the weight $\alpha_6$ with the weight $\alpha_5$, as in the example of FIG. 5, and determine an additional modified weight set. The additional modified weight set includes ten "$\alpha_2$"s, three "$\alpha_3$"s, fourteen "$\alpha_5$", three "$\alpha_7$"s, four "$\alpha_8$"s, five "$\alpha_9$"s, and seven "$\alpha_{10}$"s. The compression apparatus 210 may determine frequency information 510 for the additional modified weight set and generate a compression result 520 by compressing the additional modified weight set based on the frequency information 510. The compression apparatus 210 may determine the compression result 520 to be the final compression result.

Depending on the implementation, the compression apparatus 210 may train the neural network to fine-tune the additional modified weight set. In this example, the compression apparatus 210 may train the neural network while fixing the weight that has changed. In detail, the compression apparatus 210 may identify or distinguish between the weights $\alpha_2$ and $\alpha_5$ having a distribution change and the weights $\alpha_3$, $\alpha_7$, $\alpha_8$, $\alpha_9$, and $\alpha 10$ having no distribution change in the additional modified weight set. The compression apparatus 210 may train the neural network not to tune the weights $\alpha_2$ and $\alpha_5$ having a distribution change but to tune the weights $\alpha_3$, $\alpha_7$, $\alpha_8$, $\alpha_9$, and $\alpha 10$ having no distribution change. Accordingly, the inference accuracy of the neural network may improve further. The compression apparatus 210 may compress the not-tuned weights $\alpha_2$ and $\alpha_5$ and the tuned weights $\alpha_3$, $\alpha_7$, $\alpha_8$, $\alpha_9$, and $\alpha 10$ and determine a result of compressing the not-tuned weights $\alpha_2$ and $\alpha_5$ and the tuned weights $\alpha_3$, $\alpha_7$, $\alpha_8$, $\alpha_9$, and $\alpha 10$ to be the final compression result.

Hereinafter, an example of using RLC as the compression scheme will be described with reference to FIGS. 6 and 7.

Figure 6:
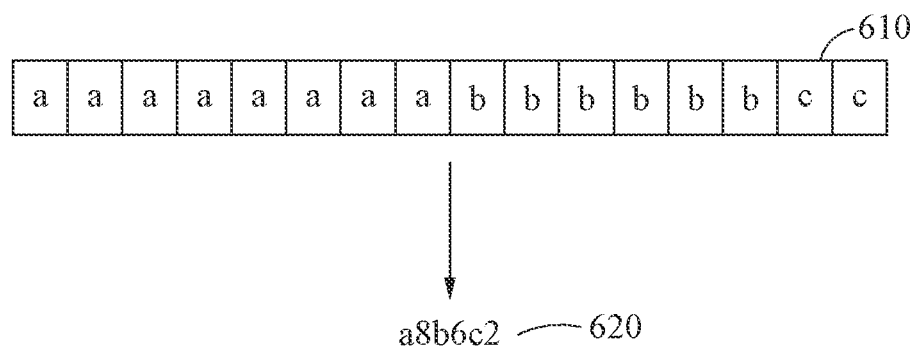

Referring to FIG. 6, the compression apparatus 210 may generate a compression result "a8b6c2" 620 by compressing a weight set 610 according to RLC.

Figure 7:
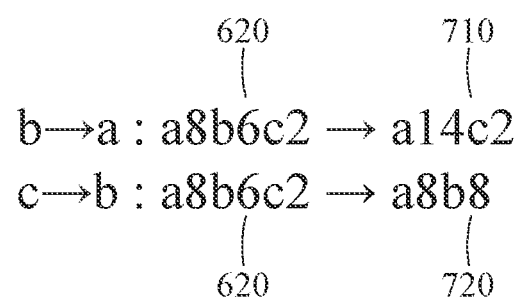

The compression apparatus 210 may find a weight "a" having the greatest repeat count in the weight set 610 and find a weight "b" neighboring the weight "a." The compression apparatus 210 may determine a modified weight set "a" by replacing the weight "b" with the weight "a" and compress the modified weight set "a." As in the example of FIG. 7, the compression apparatus 210 may generate a compression result "a14c2" 710, by compressing the modified weight set "a."

The compression apparatus 210 may calculate a compression efficiency value for the modified weight set "a" based on the compression result 620 and the compression result 710. For example, the compression apparatus 210 may calculate a difference between the size of the compression result 620 and the compression result 710. The compression apparatus 210 may calculate a change error between the weight set 610 and the modified weight set "a." In detail, the compression apparatus 210 may calculate the change error between the weight set 610 and the modified weight set "a" by multiplying the difference "b–a" between the weight "b" and the weight "a" by the repeat count of the weight "b." The compression apparatus 210 may calculate the compression efficiency value for the modified weight set "a" based on the calculated size difference and the calculated change error.

The compression apparatus 210 may find the weight "b" having the second greatest repeat count in the weight set. The repeat count of the weight "a" neighboring the weight "b" is greater than the repeat count of the weight "b," and the repeat count of a weight "c" neighboring the weight "b" is less than the repeat count of the weight "b." The compression apparatus 210 may determine a modified weight set "b" by replacing the weight "c" with the weight "b" and compress the modified weight set "b." As in the example of FIG. 7, the compression apparatus 210 may generate a compression result "a8b8" 720 by compressing the modified weight set "b." Similar to the compression efficiency value for the modified weight set "a" described above, the compression apparatus 210 may calculate a compression efficiency value for the modified weight set "b" based on the compression result 620 and the compression result 720.

When the compression efficiency value for the modified weight set "b" is greater than the compression efficiency value for the modified weight set "a," the compression apparatus 210 may determine a final compression result based on the modified weight set "b." As an example, the compression apparatus 210 may determine the compression result 720 to be the final compression result. As another example, the compression apparatus 210 may train the neural network to perform fine-tuning on the modified weight set "b." Since the weight "c" is replaced with the weight "b" in the modified weight set "b," the compression apparatus 210 may train the neural network not to tune the weight "b" having a repeat count change but to tune the weight "a" having no repeat count change. The compression apparatus 210 may determine a result of compressing the tuned weight "a" and the not-tuned weight "b" to be the final compression result.

Figure 8:
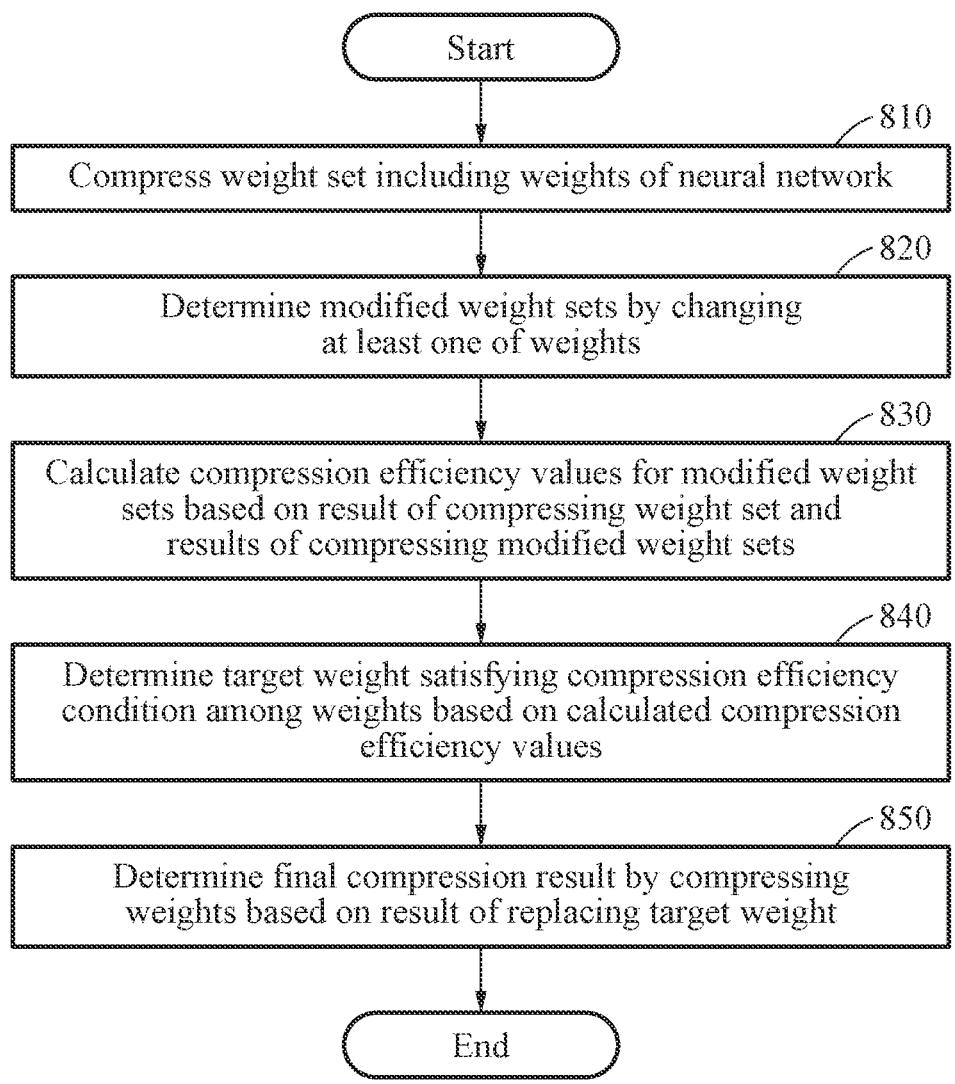
FIG. 8 illustrates an example of a method of compressing weights of a neural network.

FIG. 8 illustrates an example of a method of compressing weights of a neural network.

Referring to FIG. 8, in operation 810, the compression apparatus 210 compresses a weight set including weights of a neural network.

In operation 820, the compression apparatus 210 determines modified weight sets by changing at least one of the weights. In further detail, the compression apparatus 210 may select at least one of the weights based on the distribution of the weights. The distribution of the weights may include, for example, frequency information on the weights or the repeat counts of the weights. However, examples are not limited thereto. For example, the compression apparatus 210 may select the most frequent weight or a weight having the greatest repeat count and find a weight nearest the selected weight. Here, the term "nearest" may refer to having the smallest difference from the selected weight. The compression apparatus 210 may change the weight nearest the selected weight to the selected weight. In the example described above with reference to FIG. 4, the compression apparatus 210 may find the weight $\alpha_4$ nearest the most frequent weight $\alpha_5$ and determine a first modified weight set by changing the weight $\alpha_4$ to the weight $\alpha_5$. In this way, the compression apparatus 210 may determine modified weight sets by repeating weight selection and replacement.

In operation 830, the compression apparatus 210 may calculate compression efficiency values for the modified weight sets based on a result of compressing the weight set and results of compressing the determined modified weight sets. Since this operation has been described in detail above, a further detailed description will be omitted here for conciseness.

In operation 840, the compression apparatus 210 determines a target weight satisfying a compression efficiency condition among the weights based on the calculated compression efficiency values. In operation 850, the compression apparatus 210 determines a final compression result by compressing the weights based on a result of replacing the determined target weight. In other words, the compression apparatus 210 may select at least one of the weight sets based on the calculated compression efficiency values and determine the final compression result based on a result of the selection. As an example, when the first modified weight set described above has the greatest compression efficiency value, the compression apparatus 210 may select the first modified weight set. The compression apparatus 210 may determine the compression result 420 generated by compressing the first modified weight set to be the final compression result. As another example, the compression apparatus 210 may compare the compression efficiency values for the modified weight sets with a threshold. In this example, the compression apparatus 210 may determine each of different weights to be a target weight when compression efficiency values for n modified weight sets being greater than a threshold, where the n modified weight sets are determined by replacing each of the different weights with a weight neighboring each of the different weights. In detail, when the compression efficiency value of each of the first to third modified weight sets described above is greater than or equal to the threshold, the compression apparatus 210 may determine each of the weight $\alpha_1$, the weight $\alpha_4$, and the weight $\alpha_6$ to be a target weight. The compression apparatus 210 may determine an additional modified weight set by replacing the weight $\alpha_1$ with the weight $\alpha_2$, the weight $\alpha_4$ with the weight $\alpha_5$, and the weight $\alpha_6$ with the weight $\alpha_5$ and determine the final compression result based on the additional modified weight set.

The description provided with reference to FIGS. 1 through 7 may also apply to the description of FIG. 8, and thus a further detailed description will be omitted for conciseness.

Figure 9:
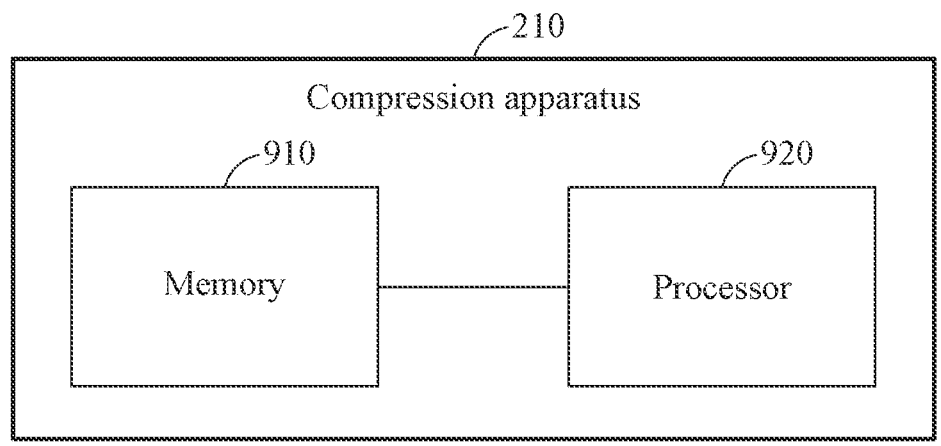
FIG. 9 illustrates an example of a compression apparatus.

FIG. 9 illustrates an example of a compression apparatus.

Referring to FIG. 9, the compression apparatus 210 includes a memory 910 and a processor 920.

The memory 910 may store the weights of a neural network.

The processor 920 may control or perform the overall operation of the compression apparatus 210.

The processor 920 may compress a weight set, including the weights.

The processor 920 may determine modified weight sets by changing at least one of the weights.

The processor 920 may calculate compression efficiency values for the modified weight sets based on a result of compressing the weight set and results of compressing the determined modified weight sets.

The processor 920 may determine a target weight satisfying a compression efficiency condition among the weights based on the calculated compression efficiency values.

The processor 920 may determine a final compression result by compressing the weights based on a result of replacing the determined target weight.

The description provided with reference to FIGS. 1 through 7 may also apply to the description of FIG. 8, and thus a further detailed description will be omitted for conciseness.

Figure 10:
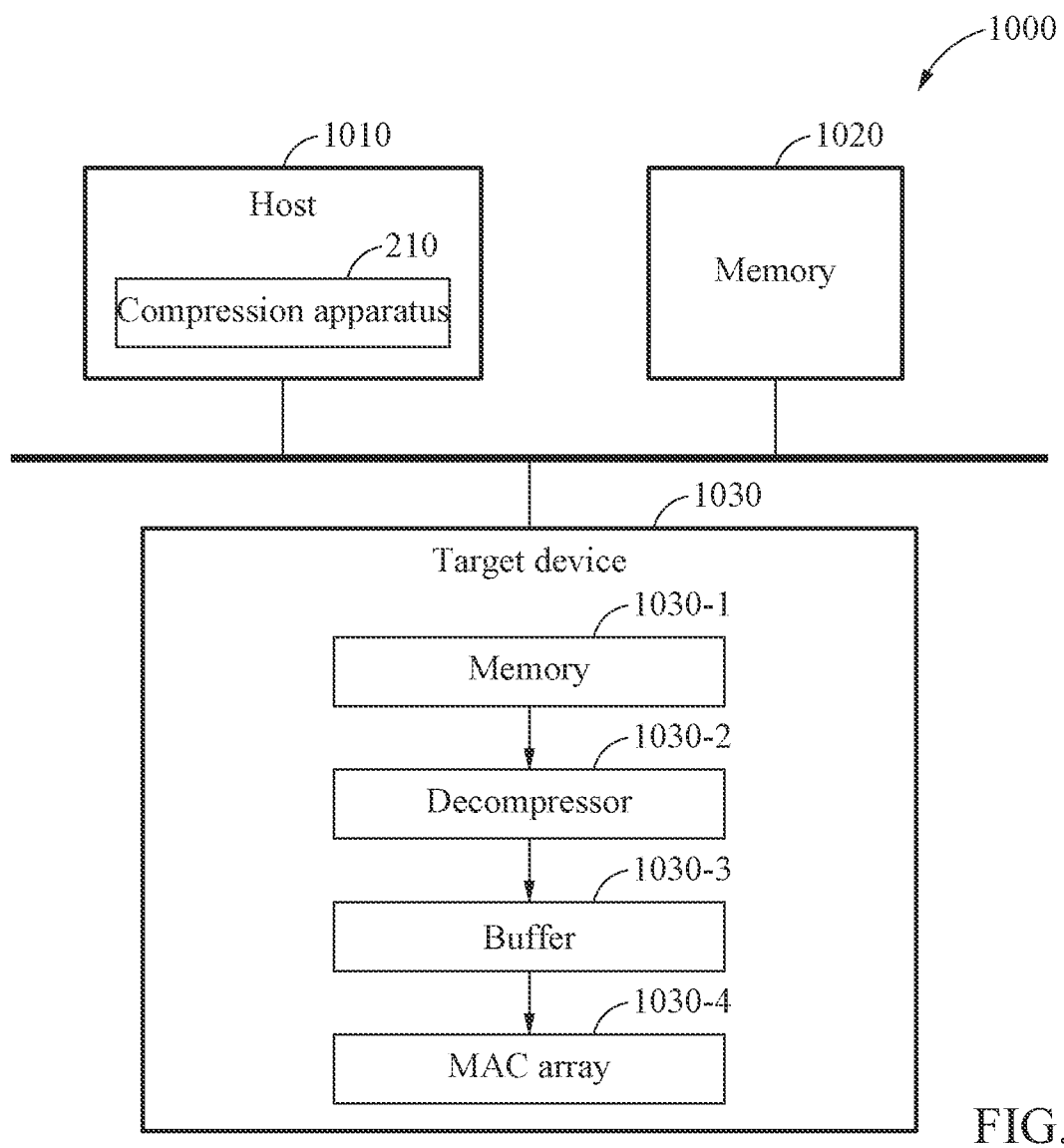
FIG. 10 illustrates an example of a system including a compression apparatus and a target device.

FIG. 10 illustrates an example of a system including a compression apparatus and a target device.

Referring to FIG. 10, a system 1000 includes a host 1010, a memory 1020, and a target device 1030.

The system 1000 may be implemented as a server system. Examples are not limited thereto, and the system 1000 may be implemented as a mobile terminal such as a smartphone or a tablet PC.

The host 1010 includes the compression apparatus 210.

The memory 1020 may be a dynamic random-access memory (DRAM). However, examples are not limited thereto.

The compression apparatus 210 may store a final compression result in the memory 1020.

The target device 1030 may be a device for performing inference of a neural network and include, for example, an NPU, a GPU, and the like. However, examples are not limited thereto. Such inference may include, for example, object classification, object detection, object tracking, object identification, object recognition, user authentication, and the like. However, examples are not limited thereto.

The target device 1030 may retrieve the final compression result from the memory 1020 and store the retrieved final compression result in a memory 1030-1. The memory 1030-1 may be a static random-access memory (SRAM). However, examples are not limited thereto.

A decompressor 1030-2 in the target device 1030 may decompress the final compression result stored in the memory 1030-1. For example, the final compression result may correspond to the compression result 420 described with reference to FIG. 4. The decompressor 1030-2 may obtain two "$\alpha_1$"s, eight "$\alpha_2$"s, three "$\alpha_3$"s, ten "$\alpha_5$"s, four "$\alpha_6$"s, three "$\alpha_7$"s, four "$\alpha_8$"s, five "$\alpha_9$"s, and seven "$\alpha_{10}$"s by decompressing the compression result 420.

The decompressor 1030-2 may store a decompression result in a buffer 1030-3.

A multiply-accumulate (MAC) array 1030-4 may operate based on the weights stored in the buffer 1030-3. A result of the inference of the neural network may be generated through the operation.

The target device 1030 may transmit the result of the inference of the neural network to the host 1010.

The description provided with reference to FIGS. 1 through 9 may also apply to the description of FIG. 10, and thus a detailed description will be omitted for conciseness.

The compression apparatus 210, memory 910, 1020, and 1030-1, processor 920, system 1000, host 1010, target device 1030, decompressor 1030-2, buffer 1030-3, and MAC array 1030-4 in FIGS. 1-10 that perform the operations described in this application are implemented by hardware components configured to perform the operations described in this application that are performed by the hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1-10 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A processor-implemented method of compressing weights of a neural network, the method comprising:
   compressing a weight set including the weights of the neural network;
   determining modified weight sets by changing at least one of the weights;
   calculating compression efficiency values for the determined modified weight sets based on a result of compressing the weight set and results of compressing the determined modified weight sets;
   selecting one of the determined modified weight sets based on the calculated compression efficiency values; and
   determining a compression result generated by compressing the selected modified weight sets to be a final compression result of the weights.

2. The method of claim 1, wherein the selecting comprises selecting determined modified weight set having greatest compression efficiency value.

3. The method of claim 1, wherein the calculating comprises:
   calculating differences between a size of the result of compressing the weight set and sizes of the results of compressing the determined modified weight sets;
   calculating change errors between the weight set and the determined modified weight sets; and
   calculating the compression efficiency values for the determined modified weight sets based on the calculated differences and the calculated change errors.

4. The method of claim 3, wherein the calculating of the change errors comprises calculating, in response to a first modified weight set being determined by changing a first weight of the weights to a weight neighboring the first weight, a change error between the weight set and the first modified weight set based on a frequency of the first weight and a difference between the first weight and the weight neighboring the first weight.

5. The method of claim 1, wherein the determining of the modified weight sets comprises:
   selecting one of the weights based on a distribution of the weights; and
   changing a weight neighboring the selected weight to the selected weight.

6. The method of claim 1, wherein the determining of the modified weight sets comprises determining n modified weight sets by replacing each of different weights of the weights with a weight neighboring each of the different weights, where n is a natural number.

7. A non-transitory computer-readable storage medium storing instructions that, when executed by one or more processors, cause the one or more processors to perform the method of claim 1.

8. A compression apparatus, comprising:
   one or more processors configured to:
   compress a weight set including weights of a neural network,
   determine modified weight sets by changing at least one of the weights,
   calculate compression efficiency values for the determined modified weight sets based on a result of compressing the weight set and results of compressing the determined modified weight sets,
   select one of the determined modified weight sets based on the calculated compression efficiency values; and
   determine a compression result generated by compressing the selected modified weight sets to be a final compression result of the weights.

9. The compression apparatus of claim 8, wherein the one or more processors are configured to select determined modified weight set having greatest compression efficiency value.

10. The compression apparatus of claim 8, wherein the one or more processors are further configured to calculate differences between a size of the result of compressing the weight set and sizes of the results of compressing the determined modified weight sets, calculate change errors between the weight set and the determined modified weight sets, and calculate the compression efficiency values for the determined modified weight sets based on the calculated differences and the calculated change errors.

11. The compression apparatus of claim 10 wherein the one or more processors are further configured to calculate, in response to a first modified weight set being determined by changing a first weight of the weights to a weight neighboring the first weight, a change error between the weight set and the first modified weight set based on a frequency of the first weight and a difference between the first weight and the weight neighboring the first weight.

12. The compression apparatus of claim 8, wherein the one or more processors are further configured to select one of the weights based on a distribution of the weights, and change a weight neighboring the selected weight to the selected weight.

13. The compression apparatus of claim 8, wherein the one or more processors are further configured to determine n modified weight sets by replacing each of different weights of the weights with a weight neighboring each of the different weights, where n is a natural number.

* * * * *